United States Patent
Werner et al.

(10) Patent No.: US 7,085,300 B2
(45) Date of Patent: Aug. 1, 2006

(54) INTEGRAL VERTICAL CAVITY SURFACE EMITTING LASER AND POWER MONITOR

(75) Inventors: Thomas R. Werner, Minneapolis, MN (US); James K. Guenter, Garland, TX (US)

(73) Assignee: Finisar Corporation, Sunnyvale, CA (US)

(*) Notice: Subject to any disclaimer, the term of this patent is extended or adjusted under 35 U.S.C. 154(b) by 20 days.

(21) Appl. No.: 10/028,439

(22) Filed: Dec. 28, 2001

(65) Prior Publication Data
US 2003/0123508 A1 Jul. 3, 2003

(51) Int. Cl.
*H01S 5/00* (2006.01)
(52) U.S. Cl. .................... 372/50.1; 372/50.21
(58) Field of Classification Search ............ 372/36, 372/50, 50.1; 257/59
See application file for complete search history.

(56) References Cited

U.S. PATENT DOCUMENTS

| | | | |
|---|---|---|---|
| 4,906,839 A | 3/1990 | Lee | |
| 5,123,024 A | 6/1992 | Dowd et al. | |
| 5,239,189 A | 8/1993 | Lawrence | |
| 5,298,735 A | 3/1994 | Peterson et al. | |
| 5,475,701 A | 12/1995 | Hibbs-Brenner | |
| 5,491,712 A | 2/1996 | Lin et al. | |
| 5,574,744 A * | 11/1996 | Gaw et al. | 372/50.21 |
| 5,577,064 A | 11/1996 | Swirhun et al. | |
| 5,648,979 A | 7/1997 | Mun et al. | |
| 5,737,348 A | 4/1998 | Smith | |
| 5,757,836 A | 5/1998 | Jiang et al. | |
| 5,761,229 A | 6/1998 | Baldwin et al. | |
| 5,799,030 A | 8/1998 | Brenner | |
| 5,812,581 A | 9/1998 | Cox | |
| 5,812,582 A | 9/1998 | Gilliland et al. | |

(Continued)

FOREIGN PATENT DOCUMENTS

EP 0 975 072 A2 1/2000

(Continued)

OTHER PUBLICATIONS

IEEE Photonics Technology Letters, vol. 14. No. 12, Dec. 2002 "Single High-Order Transverse Mode Surface-Emitting Laser With Controlled Far-Field Pattern," S. Shinada and F. Koyama, Member IEEE, pp. 1641-1643.

(Continued)

*Primary Examiner*—Minsun Oh Harvey
*Assistant Examiner*—Dung Nguyen
(74) *Attorney, Agent, or Firm*—Workman Nydegger (57) ABSTRACT

An integral vertical cavity surface emitting laser (VCSEL) and power monitor assembly. The assembly is beneficially fabricated by anisotropically etching a silicon substrate having substantially flat top and bottom surfaces to form a cavity defined by an inwardly sloping wall that extends through the silicon substrate, beneficially to a membrane. A photodetector (light sensor) is formed adjacent the cavity (such as on a membrane), and a VCSEL is attached to the silicon substrate such that light from the VCSEL irradiates the photodetector. Beneficially, the photodetector is a metal-semiconductor-metal photodetector. An optical element (a lens) and the end of an optical fiber are beneficially located in the cavity. The optical element couples light that passes through the photodetector into the optical fiber.

25 Claims, 4 Drawing Sheets

U.S. PATENT DOCUMENTS

| | | | |
|---|---|---|---|
| 6,069,905 A | 5/2000 | Davis et al. | |
| 6,078,601 A | 6/2000 | Smith | |
| 6,081,638 A | 6/2000 | Zhou | |
| 6,597,713 B1 * | 7/2003 | Ouchi | 372/36 |
| 2001/0015992 A1 * | 8/2001 | Kimizuka et al. | 372/50 |
| 2002/0003231 A1 * | 1/2002 | Sun et al. | 257/59 |
| 2003/0109142 A1 * | 6/2003 | Cable et al. | 438/708 |

FOREIGN PATENT DOCUMENTS

| | | | |
|---|---|---|---|
| WO | WO 01/73903 A2 | 10/2001 | |
| WO | WO 01/80324 A2 | 10/2001 | |

OTHER PUBLICATIONS

International Search Report, dated May 6, 2003, relative to PCT application No. PCT/US 02/41737, the foreign equivalent to the instant U.S. Appl. No. 10/028,439.

Holm, J, et al., "Through-etched silicon carriers for passive alignment of optical fibers to surface-active Optoelectronic components", article, Sensors and Actuators, vol. 82, May 2000, pp. 245-8.

* cited by examiner

INTEGRAL VERTICAL CAVITY SURFACE EMITTING LASER AND POWER MONITOR

CROSS-REFERENCE TO RELATED APPLICATIONS

Not Applicable.

BACKGROUND OF THE INVENTION

1. Field of the Invention

This invention relates to vertical cavity surface emitting lasers. More specifically, it relates to vertical cavity surface emitting lasers having integrally packaged power monitors.

2. Discussion of the Related Art

Vertical cavity surface emitting lasers (VCSELs) represent a relatively new class of semiconductor lasers. While there are many variations of VCSELs, one common characteristic is that they emit light perpendicular to a wafer surface. VCSELs can be formed from a wide range of material systems to produce specific characteristics. VCSELs typically have active regions, distributed Bragg reflector (DBR) mirrors, current confinement structures, substrates, and contacts. Because of their complicated structure and because of their material requirements, VCSELs are usually grown using metal-organic chemical vapor deposition (MOCVD) or molecular beam epitaxy (MBE).

Figure 1:
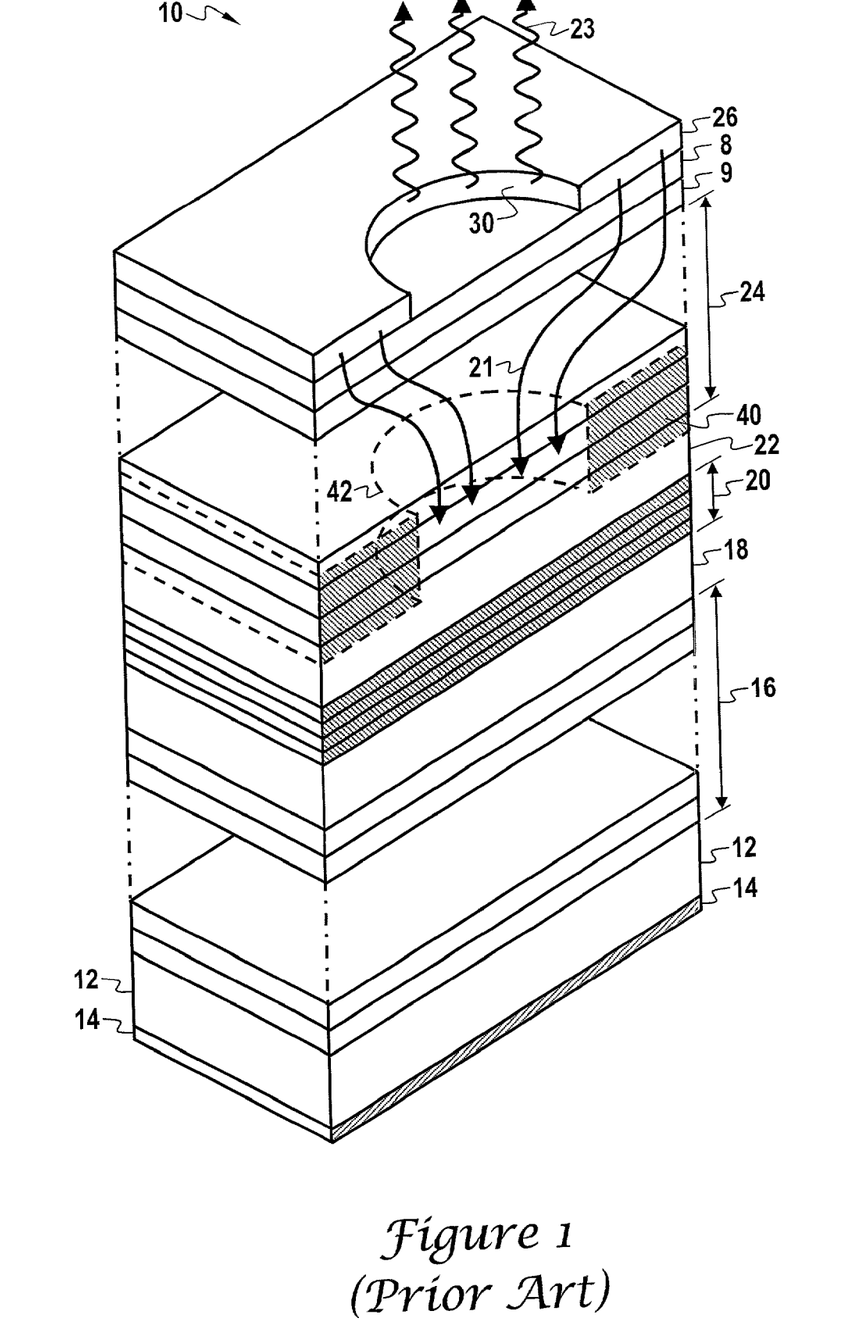
FIG. 1 illustrates a typical vertical cavity surface emitting laser.

FIG. 1 illustrates a typical VCSEL 10. As shown, an n-doped gallium arsenide (GaAS) substrate 12 is disposed with an n-type electrical contact 14. An n-doped lower mirror stack 16 (a DBR) is on the GaAS substrate 12, and an n-type graded-index lower spacer 18 is disposed over the lower mirror stack 16. An active region 20 with quantum wells is formed over the lower spacer 18. A p-type graded-index top spacer 22 is disposed over the active region 20, and a p-type top mirror stack 24 (another DBR) is disposed over the top spacer 22. Over the top mirror stack 24 is a p-conduction layer 9, a p-type GaAs cap layer 8, and a p-type electrical contact 26.

Still referring to FIG. 1, the lower spacer 18 and the top spacer 22 separate the lower mirror stack 16 from the top mirror stack 24 such that an optical cavity is formed. As the optical cavity is resonant at specific wavelengths, the mirror separation is controlled to resonant at a predetermined wavelength (or at a multiple thereof). At least part of the top mirror stack 24 includes an insulating region 40 that is formed by implanting protons into the top mirror stack 24 or by forming an oxide layer. The insulating region 40 has a conductive annular central opening 42. Thus, the central opening 42 forms an electrically conductive path though the insulating region 40.

In operation, an external bias causes an electrical current 21 to flow from the p-type electrical contact 26 toward the n-type electrical contact 14. The insulating region 40 and the conductive central opening 42 confine the current 21 flow through the active region 20. Some of the electrons in the current 21 are converted into photons in the active region 20. Those photons bounce back and forth (resonate) between the lower mirror stack 16 and the top mirror stack 24. While the lower mirror stack 16 and the top mirror stack 24 are very good reflectors, some of the photons leak out as light 23 that travels along an optical path. Still referring to FIG. 1, the light 23 passes through the p-type conduction layer 9, through the p-type GaAs cap layer 8, through an aperture 30 in the p-type electrical contact 26, and out of the surface of the vertical cavity surface emitting laser 10.

It should be understood that FIG. 1 illustrates a typical VCSEL, and that numerous variations are possible. For example, the dopings can be changed (say, providing a p-type substrate), different material systems can be used, operational details can be varied, and additional structures, such as tunnel junctions, can be added.

While generally successful, VCSELs have are not without problems. For example, it is sometimes important to control the optical power out of a VCSEL. In many applications the desired optical power output is the highest value possible, consistent with eye safety and reliability. Ideally, the desired optical power output is achieved despite manufacturing variances and tolerances, temperature effects, and aging. It is known to sense the optical power output and to use electronic circuitry to control that output. Ideally, a VCSEL and an output power sensor are designed to work together efficiently. One way of doing this is illustrated in U.S. Pat. No. 6,069,905. That patent discloses a mirror-based laser intensity control system in which a VCSEL and an output power sensor are situated on one substrate. However, at least because of the mirror, that technique might not be optimal.

Therefore, a new technique of integrating a VCSEL and an output power sensor would be beneficial. Even more beneficial would be a technique in which an output power sensor is directly aligned with a VCSEL. Still more beneficial would be a technique of integrally packaging an output power sensor and a VCSEL such that those elements are optically aligned.

SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

Accordingly, the principles of the present invention are directed to an integrally packaged VCSEL and output power sensor that substantially obviates one or more limitations and/or disadvantages of the related art. According to the principles of the present invention, a VCSEL and an output power sensor are integrally packaged on a substrate such that the VCSEL and the output power sensor are optically aligned.

An assembly according to the principles of the present invention includes a silicon substrate having a cavity. A VCSEL is mounted on that silicon substrate and aligned such that light from the VCSEL travels along a light path that passes through the cavity, and an optical power sensor formed on the silicon substrate and disposed in the light path. Beneficially, the optical power sensor is a metal-semiconductor-metal photodetector in which the silicon substrate forms the semiconductor. However, other semiconductor photodetection devices, such as photoconductors or pn-junction photodiodes, are also suitable for use in the current invention.) Therefore, the silicon substrate is beneficially doped. Also beneficially, the silicon substrate cavity is formed by anisotropic etching.

An assembly according to the principles of the present invention can include an optical element (such as a lens) disposed in the cavity and in the light path. Furthermore, that optical element beneficially couples light from the VCSEL into an optical fiber. A compound, such as an epoxy adhesive, fills at least part of the cavity so as to retain the optical element and an end of the optical fiber in the cavity.

The novel features of the present invention will become apparent to those of skill in the art upon examination of the following detailed description of the invention or can be learned by practice of the present invention. It should be understood, however, that the detailed description of the invention and the specific examples presented, while indicating certain embodiments of the present invention, are provided for illustration purposes only because various changes and modifications within the spirit and scope of the invention will become apparent to those of skill in the art from the detailed description of the invention and claims that follow.

BRIEF DESCRIPTION OF THE DRAWING

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

In the drawings.

Note that in the drawings that like numbers designate like elements. Additionally, for explanatory convenience the descriptions use directional signals such as up and down, top and bottom, and lower and upper. Such signals, which are derived from the relative positions of the elements illustrated in the drawings, are meant to aid the understanding of the present invention, not to limit it.

DETAILED DESCRIPTION OF THE ILLUSTRATED EMBODIMENTS

Reference will now be made in detail to an embodiment of the present invention, example of which is illustrated in the accompanying drawings.

The principles of the present invention provide for integrally packaged VCSEL and optical power sensor assemblies. An example of such an assembly is the VCSEL and optical power sensor assembly 110 illustrated in FIG. 2. That assembly 110 includes a VCSEL 112 that emits light 114 through an optical power sensor 116. Both the VCSEL 112 and the optical power sensor 116 are on a semiconductor substrate 118. The VCSEL 112 is attached to the semiconductor substrate 118 by a metallic ring or pads 120, which is/are deposited on the semiconductor substrate 118, and by solder bumps 122. The solder bumps 122 contact the bottom of the VCSEL 112, which includes metallic contacts. The top of the VCSEL 112 optionally includes a contact 113 to which a lead 115 is attached.

Figure 2:
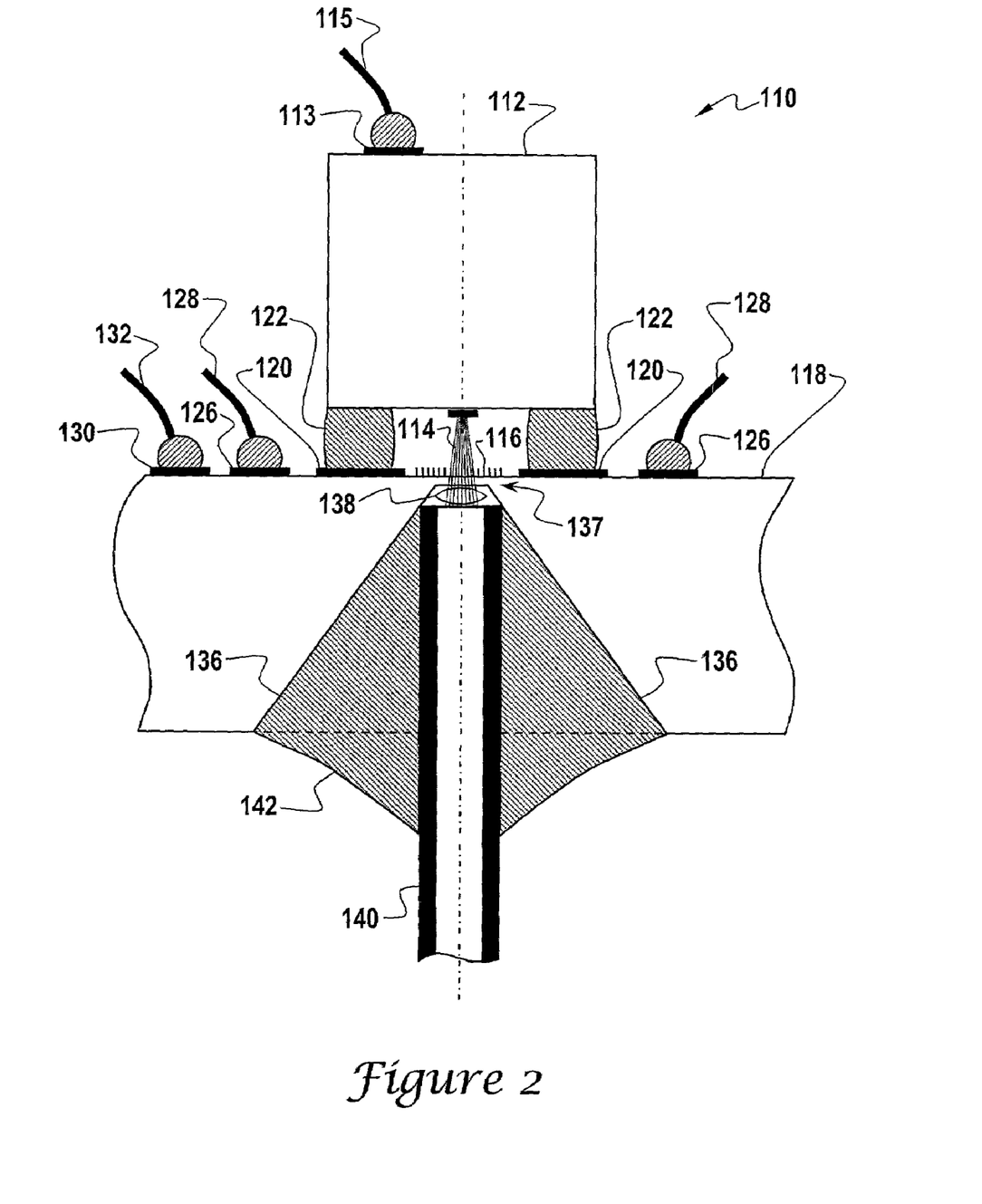
FIG. 2 illustrates a sectional view of an integrally packaged VCSEL and optical power sensor assembly according to the principles of the present invention.

The optical power sensor 116 is beneficially a metal-semiconductor-metal photodetector that is fabricated on the silicon substrate 118. Also fabricated on the silicon substrate 118 are contacts 126 for detector leads 128, and a contact 130 for a VCSEL lead 132. The silicon substrate 118 also includes conductive traces that connect the contacts 126 to the optical power sensor 116, and that connect the contact 130 to the ring 120. In another configuration two separate contacts for the VCSEL are fabricated on a single surface. In that configuration the contact 113 and the wire 115 are replaced by traces on the silicon substrate and by separated solder bumps 122. Still referring to FIG. 2, the silicon substrate 118 includes a cone-shaped cavity 136 having inwardly sloping walls that are narrower at the top and broader at the bottom. In the cavity 136 is an optional optical element 138, which is beneficially a micro-optic lens, and the end portion of an optical fiber 140. FIG. 2 illustrates an optional thin silicon membrane 137 between the optical power sensor 116 and the optical element 138. In some applications that membrane is either completely or partially removed. A sealing compound 142, beneficially an epoxy material, retains the optical element 132 and the end portion of the optical fiber 140 within the cavity 136.

Figure 3:
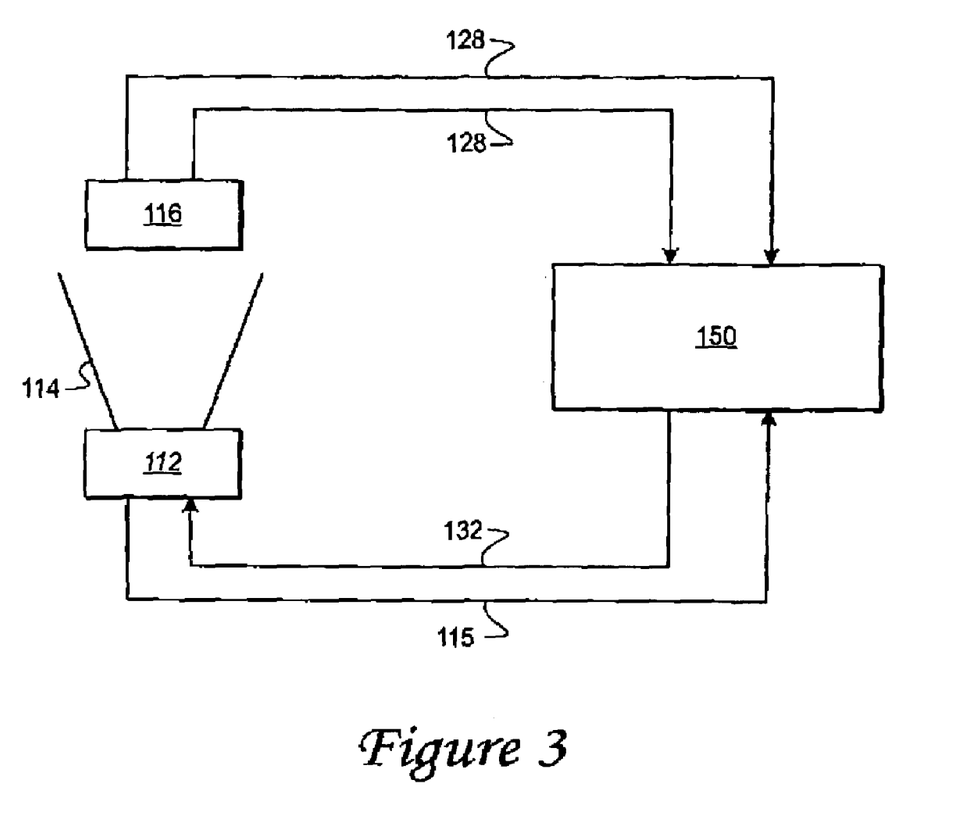
FIG. 3 illustrates controlling the optical power sensor of the VCSEL illustrated in FIG. 2.

The operation of the VCSEL and optical power sensor assembly 10 will be explained with the assistance of FIGS. 2 and 3. A controller 150 receives information from the optical power sensor 116 via leads 128. The controller 150 then compares that information with predetermined information to determine whether the VCSEL is producing light 114 with a predetermined optical power. The information from the optical power sensor 116 depends on the light 114 that irradiates the optical power sensor 116. If the information from the optical power sensor 116 shows that the VCSEL is not producing enough power output, the current through the VCSEL is increased using current on lines 132 and 115 (via the contacts 130 and 113, and the ring 120 and the solder bump 122). Since the optical power sensor 116 absorbs and blocks only part of the light 114, the remaining light 114 is collected by the optical element 138 and coupled into the optical fiber 140.

Figure 4:
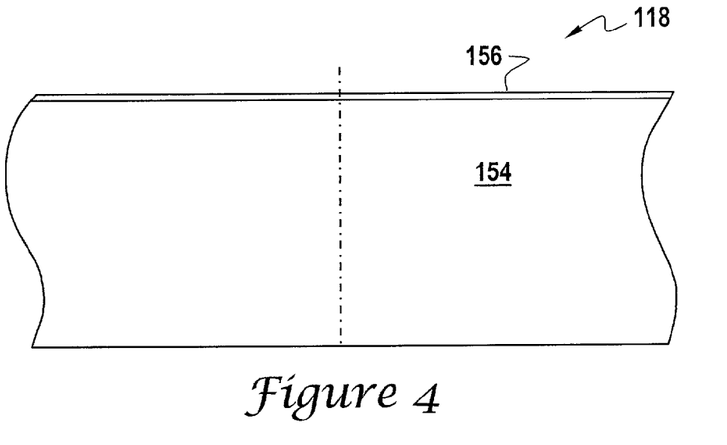
FIG. 4 illustrates a sectional view of a portion of an n-type silicon <100> substrate used in the integrated VCSEL and optical power sensor assembly illustrated in FIG. 2, during the fabrication of that assembly.
Figure 5:
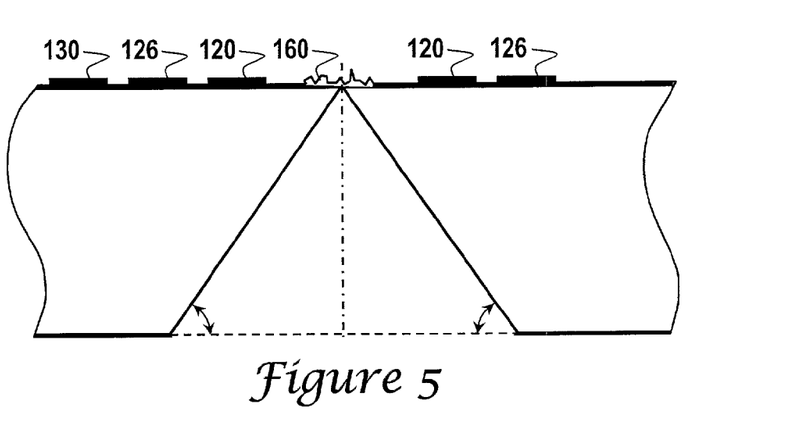
FIG. 5 illustrates the silicon substrate of FIG. 4 after anisotropic etching.
Figure 6:
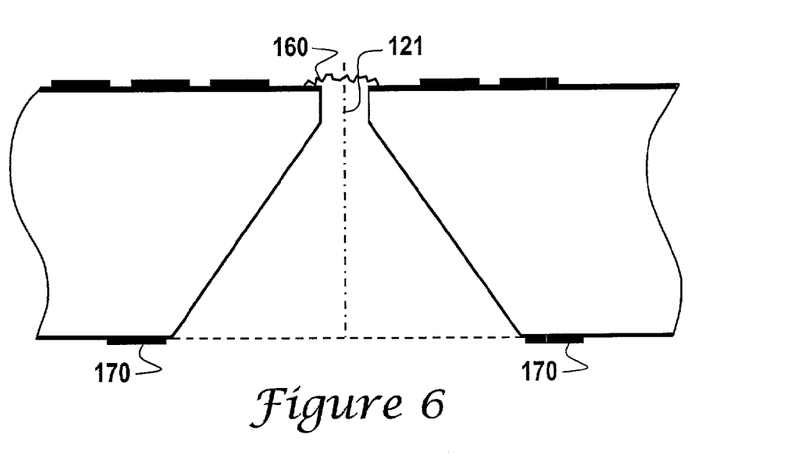
FIG. 6 illustrates the silicon substrate of FIG. 5 after contact ring formation, and after an optional reactive ion etching of the silicon substrate.

A suitable method for fabricating the silicon substrate and its cavity is illustrated in FIGS. 4, 5, and 6. Referring now to FIG. 4, that method begins with the procurement of a silicon <100> substrate 118, say about 400 microns thick. That substrate is then doped to form an N-type body 154 having a thin P/P$^+$-type layer 156 at its surface.

Next, referring now to FIG. 5, the ring 120, the contacts 126 and 130, a metal layer 160 for the optical power sensor 116, and the electrical interconnects are then formed on the silicon substrate using standard semiconductor fabrication techniques.

Referring now to FIG. 6, the bottom of the silicon substrate is then protected with an etch protector (such as silicon nitride), and an opening through that etch protector is formed at the desired location, again using standard photolithographic techniques. The opening exposes an area of the silicon substrate to chemical action. The exposed area is then anisotropically etched (using a suitable etchant such as potassium hydroxide). The anisotropic etching proceeds along crystalline planes at inwardly sloping angles so that the resulting cavity is wider at its bottom then at its top. Etching is stopped when a thin membrane 137 (see FIG. 2) is formed. If the membrane 137 is to remain in place, the fabrication of the silicon substrate 118 stops. Alternatively, the membrane can be reactive ion etched to form an opening 121 from the cavity through the silicon substrate 118. This improves light transmission through from the VCSEL 112 to the optical fiber 140 (see FIG. 2). The etch protector is then removed. An optional final step would be to coat the bottom of the membrane with a thin, partially transparent material such as a metal film. This provides the opportunity to reduce the transmission from the VCSEL through the detector 116 and membrane 137, should that be desired.

With the silicon substrate complete the VCSEL and leads 132 and 128 are soldered to the ring 120 and contacts 130 and 126. Then, the lead 115 is soldered to the contact 113. The resulting structure is then inverted and the optical element 138 is placed in the cavity 136. An end portion of the optical fiber 140 is then located in position adjacent the optical element 130. With standard lithographic and manufacturing techniques, the entire assembly is self-aligning. The VCSEL aligns to the detector 116 and the cavity 136 thorough surface tension of the attachment solder 122. Additionally, the fiber 140 and the optional optical element 138 align to the cavity 136 through the interference with the sloping sidewalls. The cavity is then filled with a sealant 142 (beneficially an epoxy). After the sealant hardens, the resulting integral assembly can be located on a PC board (via rings 170 formed on the silicon substrate 118, reference FIG. 6) or packaged in a carrier (not shown).

Referring now to FIG. 6, the bottom of the silicon substrate is then protected with an etch protector (such as silicon nitride), and an opening through that etch protector is formed at the desired location, again using standard photolithographic techniques. The opening exposes an area of the silicon substrate to chemical action. The exposed area is ten anisotropically etched (using a suitable etchant such as potassium hydroxide), The anisotropic etching proceeds along crystalline planes at inwardly sloping angles so that the resulting cavity is wider at its bottom than at its top. Etching is stopped when a thin membrane 137 (see FIG. 2) is formed. If the membrane 137 is to remain in place, the fabrication of the silicon substrate 118 stops. Alternatively, the membrane can be reactive ion-etched to form an opening 121 from the cavity through the silicon substrate 118. This improves light transmission through from the VCSEL 112 to the optical Fiber 140 (sec FIG. 2). The etch protector is then removed, An optional final step would be to coat the bottom of the membrane 137 with a thin, partially transparent material such as a metal film. This provides the opportunity to reduce the transmission from the VCSEL through the detector 116 and membrane 137, should that be desired.

The invention claimed is:

1. An integrated vertical cavity surface emitting laser and power monitor assembly, comprising:
    a vertical cavity surface emitting laser for producing a light beam along a light path;
    a semiconductive substrate having an etched cavity in said light path; and
    a light sensor on said semiconductive substrate and positioned along said light path between said vertical cavity surface emitting laser and said etched cavity in said semiconductive substrate;
    wherein said vertical cavity surface emitting laser is attached to said semiconductive substrate;
    wherein said light sensor blocks only part of the light beam produced by said vertical cavity surface emitting laser during use such that light of the light beam not blocked by said light sensor is allowed to pass into said etched cavity.

2. An assembly according to claim 1, wherein said semiconductive substrate includes a thin membrane between said etched cavity and said vertical cavity surface emitting laser.

3. An assembly according to claim 2 wherein said light sensor is on said thin membrane.

4. An assembly according to claim 1, wherein said light sensor is a metal semiconductor-metal light sensor.

5. An assembly according to claim 1, wherein said semiconductive substrate includes an aperture in said light path, wherein said aperture extends from said light sensor to said etched cavity.

6. An assembly according to claim 1, further including a metal contact on said semiconductive substrate, wherein said vertical cavity surface emitting laser is attached to said semiconductive substrate via said metal contact.

7. An assembly according to claim 6, wherein said vertical cavity surface emitting laser receives electrical power via said metal contact.

8. An integrated vertical cavity surface emitting laser and power monitor assembly, comprising:
    a vertical cavity surface emitting laser for producing a light beam along a light path;
    a substrate having an etched cavity in said light path;
    a light sensor on said substrate and along said light path;
    an optical fiber in said etched cavity and aligned in said light path;
    wherein said vertical cavity surface emitting laser is attached to said substrate;
    wherein said light sensor is positioned along said light path between said vertical cavity surface emitting laser and said optical fiber.

9. An assembly according to claim 8, further comprising an optical element between said optical fiber and said vertical cavity surface emitting laser.

10. An assembly according to claim 9, wherein said optical element couples light from said vertical cavity surface emitting laser into said optical fiber.

11. An assembly according to claim 10, wherein said optical element is in said etched cavity, and wherein said optical element and said optical fiber are held in said etched cavity using an adhesive.

12. An assembly according to claim 11, wherein said adhesive includes epoxy.

13. An assembly according to claim 8, further including a controller for controlling said light beam based on a signal from said light sensor.

14. A method of fabricating a semiconductor assembly, comprising:
    etching a semi conductive substrate to form a cavity;
    forming a photo detector on the semiconductive substrate; and
    mounting a vertical cavity surface emitting laser on the semi conductive substrate such that light emitted from the vertical cavity surface emitting laser travels along a light path such that a portion of the light irradiates and is absorbed by the photodetector and a portion passes through the photodetector into the cavity.

15. A method according to claim 14, wherein the cavity is formed by anisotropic etching.

16. A method according to claim 15, wherein the anisotropic etching results in a thin membrane between the cavity and a top of the silicon wafer semi conductive substrate, and wherein the photo detector is formed on the thin membrane.

17. A method according to claim 16, wherein at least part of the thin membrane is removed.

18. A method according to claim 14, further including:
    forming a metal contact on the semiconductive substrate; and
    attaching the vertical cavity surface emitting laser to the metal contact.

19. A method according to claim 14, further including; disposing an optical element in the etched cavity;
locating an end of an optical fiber in the etched cavity such that the end of the optical fiber is optically aligned with the disposed optical element; and
sealing the disposed optical element and the end of the optical fiber in the etched cavity.

20. A method according to claim 14, further including making electrical connections between a controller and the photo detector and the vertical cavity surface emitting laser.

21. A assembly according to claim 1, wherein the semiconductive substrate includes a silicon substrate.

22. A assembly according to claim 8, wherein the substrate includes a silicon substrate.

23. A method according to claim 14, wherein the semiconductive substrate includes a silicon substrate.

24. An integrated vertical cavity surface emitting laser and power monitor assembly, comprising:
a vertical cavity surface emitting laser for producing a light beam along a light path;
a semiconductive substrate having an etched cavity in said light path and including a thin membrane between said etched cavity and said vertical cavity surface emitting laser; and
a light sensor on said semiconductive. substrate and positioned on said thin membrane of said substrate along said light path;
wherein said vertical cavity surface emitting laser is attached to said semiconductive substrate;
wherein said light sensor blocks only part of the light beam produced by said vertical cavity surface emitting laser during use such that light of the light beam not blocked by said light sensor is allowed to pass into said etched cavity.

25. An integrated vertical cavity surface emitting laser and power monitor assembly, comprising:
a vertical cavity surface emitting laser configured to produce light along a light path;
a substrate having a cavity positioned in said light path, and said vertical cavity surface emitting laser being attached to said substrate; and
an optical power sensor disposed on a surface of said substrate and positioned in said light path between said vertical cavity surface emitting laser and said cavity.

\* \* \* \* \*

UNITED STATES PATENT AND TRADEMARK OFFICE
CERTIFICATE OF CORRECTION

PATENT NO. : 7,085,300 B2
APPLICATION NO. : 10/028439
DATED : August 1, 2006
INVENTOR(S) : Werner et al.

It is certified that error appears in the above-identified patent and that said Letters Patent is hereby corrected as shown below:

Column 2
Line 7, after "VCSELs", remove [have]
Line 9, after "applications", insert --,--

Column 4
Line 25, change "10" to --110--

Column 7
Line 11, before "assembly", change "A" to --An--
Line 13, before "assembly", change "A" to --An--

Signed and Sealed this

Third Day of August, 2010

David J. Kappos
*Director of the United States Patent and Trademark Office*